United States Patent
Xie et al.

(10) Patent No.: US 10,868,085 B2
(45) Date of Patent: Dec. 15, 2020

(54) DISPLAY PANEL WITH A FLUORESCENT PROBE LAYER BETWEEN A FIRST ELECTRODE LAYER AND LIGHT EMITTING LAYER

(71) Applicant: BOE TECHNOLOGY GROUP CO., LTD., Beijing (CN)

(72) Inventors: Dini Xie, Beijing (CN); Wei Li, Beijing (CN); Xiaojin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/345,937

(22) PCT Filed: Jan. 7, 2019

(86) PCT No.: PCT/CN2019/070618
§ 371 (c)(1),
(2) Date: Apr. 29, 2019

(87) PCT Pub. No.: WO2019/205739
PCT Pub. Date: Oct. 31, 2019

(65) Prior Publication Data
US 2020/0243619 A1 Jul. 30, 2020

(30) Foreign Application Priority Data
Apr. 23, 2018 (CN) .......................... 2018 1 0366342

(51) Int. Cl.
*H01L 29/08* (2006.01)
*H01L 33/00* (2010.01)
(Continued)

(52) U.S. Cl.
CPC ..... *H01L 27/3225* (2013.01); *G01N 21/6428* (2013.01); *H01L 25/048* (2013.01);
(Continued)

(58) Field of Classification Search
CPC . H01L 27/3225; H01L 27/3223; H01L 51/56; H01L 2227/32; H01L 25/048; H01L 2251/50; H01L 33/26; G01N 21/6428
See application file for complete search history.

(56) References Cited

U.S. PATENT DOCUMENTS 9,634,285 B2 * 4/2017 Meyer ................. H01L 51/5253
2006/0121613 A1 6/2006 Havens
2008/0237872 A1 * 10/2008 Nagayama ............. H01L 22/34
257/773

FOREIGN PATENT DOCUMENTS

CN 102197299 A 9/2011
CN 104823300 A 8/2015
(Continued)

OTHER PUBLICATIONS

International Search Report and Written Opinion for International Appl. No. PCT/CN2019/070618, dated Mar. 14, 2019.
(Continued)

*Primary Examiner* — Alonzo Chambliss
(74) *Attorney, Agent, or Firm* — The Webb Law Firm

(57) ABSTRACT

The present disclosure provides a display panel and a method for manufacturing the same, a detection method and a display device, and relates to the field of display technology. The display panel includes one or more detection units located on a substrate, wherein at least one of the one or more detection units comprises: a first electrode layer and a second electrode layer opposite to the first electrode layer; a light emitting layer located between the first electrode layer and the second electrode layer; and a fluorescent probe layer located between the first electrode layer and the light emitting layer.

19 Claims, 2 Drawing Sheets

(51) Int. Cl.
    *H01L 31/0232* (2014.01)
    *H01L 21/00* (2006.01)
    *H01L 51/40* (2006.01)
    *H01L 27/32* (2006.01)
    *G01N 21/64* (2006.01)
    *H01L 51/56* (2006.01)
    *H01L 25/04* (2014.01)
    *H01L 33/26* (2010.01)

(52) U.S. Cl.
    CPC .......... *H01L 27/3223* (2013.01); *H01L 33/26* (2013.01); *H01L 51/56* (2013.01)

(56) References Cited

FOREIGN PATENT DOCUMENTS

| | | |
|---|---|---|
| CN | 106024842 A | 10/2016 |
| CN | 107369701 A | 11/2017 |
| CN | 107785406 A | 3/2018 |
| CN | 108878473 A | 11/2018 |
| JP | 2007-250254 A | 9/2007 |

OTHER PUBLICATIONS

First Office Action for CN Appl. No. 201810366342.3, dated Mar. 23, 2020.

\* cited by examiner

DISPLAY PANEL WITH A FLUORESCENT PROBE LAYER BETWEEN A FIRST ELECTRODE LAYER AND LIGHT EMITTING LAYER

CROSS-REFERENCE TO RELATED APPLICATIONS

The present application is a U.S. National Stage Application under 35 U.S.C. § 371 of International Patent Application No. PCT/CN2019/070618, filed on Jan. 7, 2019, which claims priority to China Patent Application No. 201810366342.3 filed on Apr. 23, 2018, the disclosures of which are incorporated by reference herein in entirety.

TECHNICAL FIELD

The present disclosure relates to the technical field of display, and especially to a display panel and a method for manufacturing the same, a detection method and a display device.

BACKGROUND

In the manufacturing process of an OLED (Organic Light-Emitting Diode) display panel, display defects such as low brightness may often be found at some location(s) of the OLED display panel.

SUMMARY

According to one aspect of embodiments of the present disclosure, a display panel is provided. The display panel comprises one or more detection units located on a substrate, wherein at least one of the one or more detection units comprises: a first electrode layer and a second electrode layer opposite to the first electrode layer; a light emitting layer located between the first electrode layer and the second electrode layer; and a fluorescent probe layer located between the first electrode layer and the light emitting layer.

In some embodiments, at least one of the one or more detection units is located in a non-pixel area of the display panel.

In some embodiments, each of the one or more detection units is located in the non-pixel area.

In some embodiments, the first electrode layer is located between the substrate and the light emitting layer.

In some embodiments, the fluorescent probe layer is sensitive to one of temperature, humidity, or oxygen concentration.

In some embodiments, the fluorescent probe layer has a thickness ranging from 1 μm to 5 μm.

According to another aspect of embodiments of the present disclosure, a display device is provided. The display device comprises the display panel according to any one of the above embodiments.

According to still another aspect of embodiments of the present disclosure, a detection method for a display panel is provided. The display panel comprises one or more detection units located on a substrate, wherein at least one of the one or more detection units comprises: a first electrode layer and a second electrode layer opposite to the first electrode layer; a light emitting layer located between the first electrode layer and the second electrode layer; and a fluorescent probe layer located between the first electrode layer and the light emitting layer. The detection method comprises: irradiating one of the one or more detection units with excitation light to make the fluorescent probe layer in the one of the one or more detection units emit light; detecting at least one parameter of the light emitted by the fluorescent probe layer in the one of the one or more detection units; and determining an environmental parameter of the light emitting layer in the one of the one or more detection units according to the at least one parameter of the light emitted by the fluorescent probe layer in the one of the one or more detection units.

In some embodiments, the environmental parameter of the light emitting layer in the one of the one or more detection units is determined according to a correspondence between the at least one parameter of the light emitted by the fluorescent probe layer in the one of the one or more detection units and the environmental parameter of an environment in which the fluorescent probe layer in the one of the one or more detection units is located.

In some embodiments, the environmental parameter comprises one of temperature, humidity, or oxygen concentration.

In some embodiments, the at least one parameter of the light comprises at least one of wavelength or light intensity of the light.

In some embodiments, determining the environmental parameter comprises: determining a first environmental parameter of the light emitting layer in the one of the one or more detection units according to the wavelength of the light emitted by the fluorescent probe layer in the one of the one or more detection units; determining a second environmental parameter of the light emitting layer in the one of the one or more detection units according to the light intensity of the light emitted by the fluorescent probe layer in the one of the one or more detection units; determining the environmental parameter of the light emitting layer in the one of the one or more detection units according to the first environmental parameter and the second environmental parameter.

In some embodiments, determining the environmental parameter comprises: calculating an average value of the first environmental parameter and the second environmental parameter as the environmental parameter of the light emitting layer in the one of the one or more detection units.

According to yet still another aspect of embodiments of the present disclosure, a method for manufacturing a display panel display device is provided. The method comprises forming one or more detection units on a substrate, wherein forming at least one of the one or more detection units comprises: forming a first electrode layer on the substrate; forming a fluorescent probe layer and a light emitting layer on one side of the first electrode layer away from the substrate; and forming a second electrode layer, wherein the fluorescent probe layer and the light emitting layer are located between the first electrode layer and the second electrode layer.

In some embodiments, at least one of the one or more detection units is located in a non-pixel area of the display panel.

In some embodiments, each of the one or more detection units is located in the non-pixel area.

In some embodiments, the light emitting layer is formed on one side of the fluorescent probe layer away from the first electrode layer after the fluorescent probe layer is formed.

In some embodiments, the fluorescent probe layer comprises is sensitive to one of temperature, humidity, or oxygen concentration.

In some embodiments, the fluorescent probe layer has a thickness ranging from 1 μm to 5 μm.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure can be understood more clearly from the following detailed description with reference to the accompanying drawings, in which.

Figure 1:
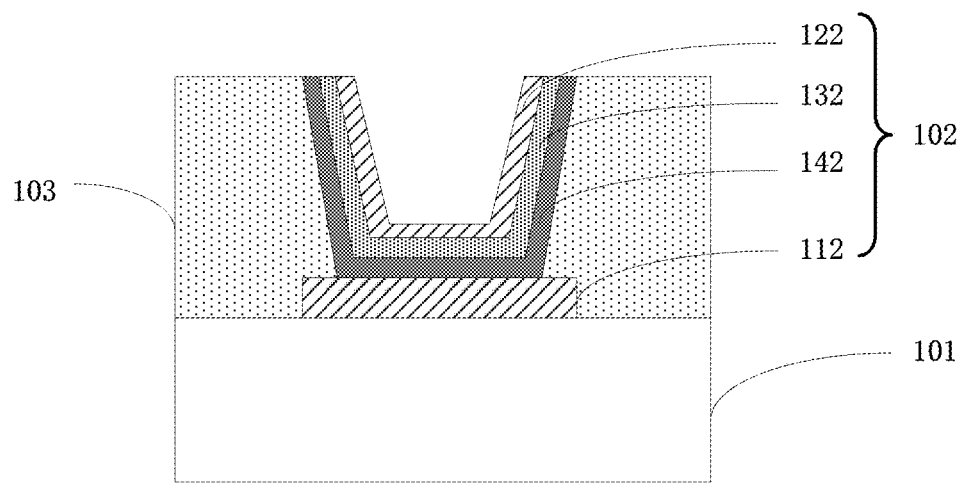
FIG. 1 is a schematic structural view showing a display panel according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The displaying defects may be caused by various reasons. Therefore, it may be difficult to determine what causes the displaying defects.

The inventors have found that, the light emitting efficiency of the light emitting layer is easily affected by the environment surrounding the light emitting layer. For example, a high-temperature or a high-humidity environment may result in a significant decrease of the light emitting efficiency of the light emitting layer. The inventors have thus realized that, if the environmental parameter of the light emitting layer can be obtained, reference can be made to analyze what causes the displaying defects.

Thus, the embodiments of the present disclosure provide the following technical solutions.

FIG. 1 is a schematic structural view showing a display panel according to an embodiment of the present disclosure.

As shown in FIG. 1, the display panel comprises one or more detection units 102 located on the substrate 101. Here, FIG. 1 schematically shows one detection unit 102. In some embodiments, different detection units 102 may be spaced apart by a pixel defining layer 103 shown in FIG. 1.

A driving circuit and various circuit elements (not shown in FIG. 1) such as a thin film transistor (TFT), a capacitor, and a resistor may be formed in the substrate 101. Here, the substrate 101 may also be referred to as a TFT substrate.

At least one detection unit 102 comprises a first electrode layer 112 and a second electrode layer 122 opposite to the first electrode layer 112, a light emitting layer 132, and a fluorescent probe layer 142. Here, one of the first electrode layer 112 and the second electrode layer 122 is an anode, and the other is a cathode.

The light emitting layer 132 is located between the first electrode layer 112 and the second electrode layer 122. The light emitting layer 132 may comprise a light emitting material layer. The light emitting layer 132 may further comprise one or more of an electron transport layer, a hole transport layer, an electron injection layer, and a hole injection layer.

The fluorescent probe layer 142 is located between the first electrode layer 112 and the light emitting layer 132. In some embodiments, the first electrode layer 112 is located between the substrate 101 and the light emitting layer 132, as shown in FIG. 1. That is, the first electrode layer 112 is closer to the substrate 101 than the second electrode layer 122. Thus adverse effect on the performance of the light emitting layer 132 when the fluorescent probe layer 142 is formed can be avoided.

In some embodiments, the fluorescent probe layer 142 may be sensitive to one of temperature, humidity, or oxygen concentration. The fluorescent probe layer sensitive to temperature may comprise, for example, a triarylboron compound or the like. The fluorescent probe layer sensitive to humidity may comprise, for example, one or more of the followings: a complex of $Eu^{3+}$, a complex of $Tb^{3+}$. The fluorescent probe layer sensitive to oxygen concentration may comprise, for example, one or more of the followings:

a ruthenium complex, a platinum complex, a palladium complex, an iridium complex.

In some embodiments, the fluorescent probe layer has a thickness ranging from 1 μm to 5 μm, for example, from 2 μm to 4 μm, for example, 3 μm, or the like. The fluorescent probe layer with such thickness range may be normally excited to emit light without affecting the formation of the light emitting layer.

In the above embodiments, a detection unit comprising a fluorescent probe layer is disposed in the display panel. The light emitted by the fluorescent probe layer may reflect the environmental parameter of the light emitting layer. Thus whether the displaying defect of the display panel is caused by the light emitting layer can be determined according to the environmental parameter of the light emitting layer.

Figure 2:
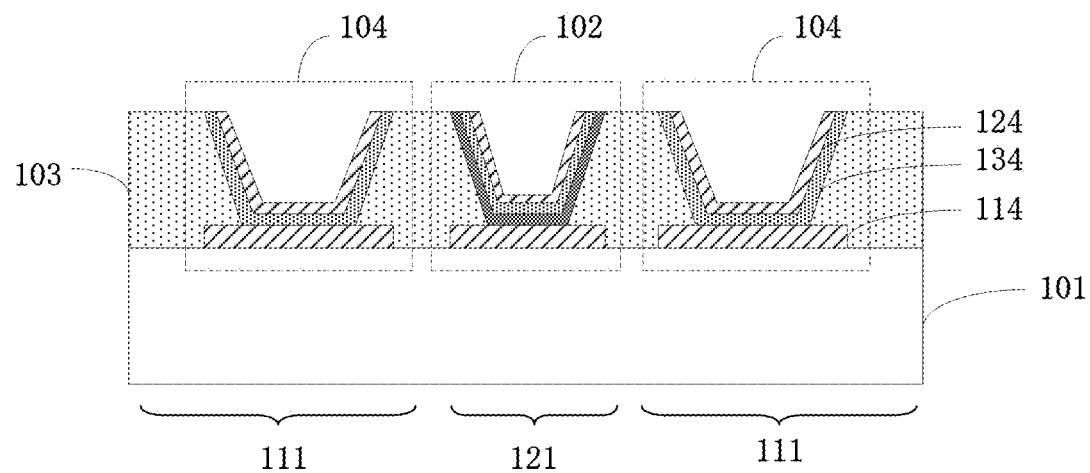
FIG. 2 is a schematic structural view showing a display panel according to another embodiment of the present disclosure.

FIG. 2 is a schematic structural view showing a display panel according to another embodiment of the present disclosure.

As shown in FIG. 2, the display panel comprises one or more detection units 102 and pixel units 104 on the substrate 101. Different pixel units 104 may be spaced apart by the pixel defining layer 103. The detection unit 102 and the pixel unit 104 may be spaced apart by the pixel defining layer 103.

The pixel unit 104 comprises a first electrode layer 114 and a second electrode layer 124 opposite to the first electrode layer 114, and a light emitting layer 134 between the first electrode layer 114 and the second electrode layer 124. Here, each pixel unit 104 may be regarded as one sub-pixel. Three pixel units 104 may constitute one pixel.

The display panel comprises a pixel area 111 and a non-pixel area 121 other than the pixel area 111. The pixel unit 104 is located in the pixel area 111, and at least one of the one or more detection units 102 is located in the non-pixel area 121.

In some implementations, some detection units 102 are located in the non-pixel area 121 and the other detection units 102 are located in the pixel area 121. Generally, one pixel area 111 is correspondingly provided with one pixel unit 104. Here, since the display panel further comprises one or more detection units 102, some of the pixel areas 111 may also be each provided with a corresponding detection unit 102. In other words, some detection units 102 may occupy positions of the pixel units 104.

In other implementations, all the detection units 102 are located in the non-pixel area 121. For example, a detection unit 102 may occupy a position of the pixel defining layer 103, that is, the detection unit 102 may be disposed in an opening other than the opening for the pixel unit 104 of the pixel defining layer 103. In such a manner, normal light emitted by the pixel unit 104 may be avoided to be affected.

Since a fluorescent probe layer 142 is disposed between the light emitting layer 132 and the first electrode layer 112 in the detection unit 102, even if a voltage is applied to the first electrode layer 112 and the second electrode layer 122 in the detection unit 102, the detection unit 102 dose not emit light. Therefore, the detection unit 102 located in the non-pixel area 121 may not affect the normal light emitted by the pixel unit 104.

In the above embodiments, at least one detection unit 102 is located in the non-pixel area 121. The effect of the detection unit 102 on the pixel unit 104 can be reduced as much as possible.

The display panel of each of the above embodiments comprises a detection unit 102. Therefore, in a case where a displaying defect is present in the display panel, for example, certain locations are present with lower brightness than other locations, the light emitted by the fluorescent probe layer 142 in the display panel can be detected to determine whether the light emitting layer 132 is normal.

A detection method for a display panel according to some embodiments of the present disclosure will be described in detail below with reference to FIG. 3.

Figure 3:
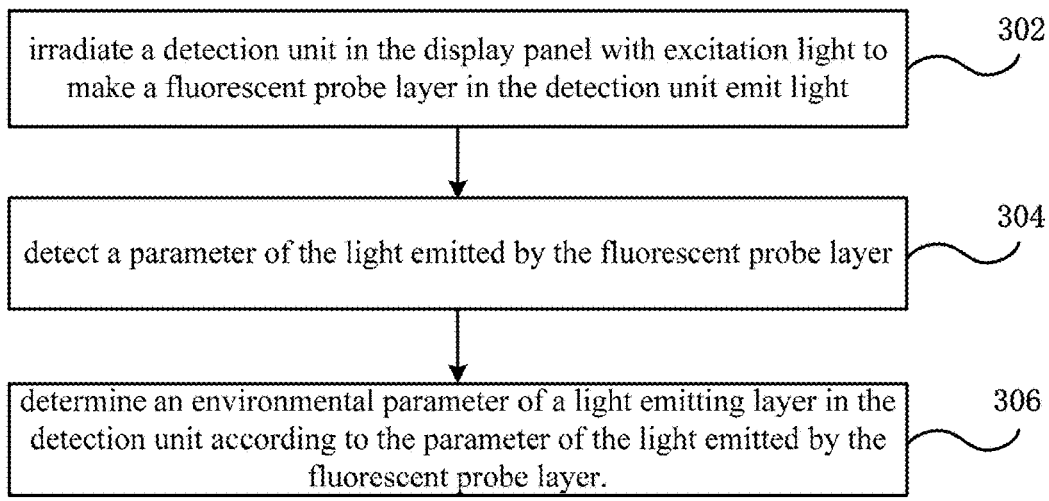
FIG. 3 is a schematic flow chart showing a detection method for a display panel according to an embodiment of the present disclosure.

FIG. 3 is a schematic flow chart showing a detection method for a display panel according to an embodiment of the present disclosure.

At step 302, a detection unit in the display panel according to any one of the above embodiments is irradiated with excitation light to make a fluorescent probe layer in the detection unit emit light.

Here, the excitation light may be selected according to the type of the fluorescent probe layer so that the fluorescent probe layer can emit light after being irradiated with the excitation light.

At step 304, a parameter of the light emitted by the fluorescent probe layer is detected.

In some embodiments, the parameter of the light may comprise the light intensity of the light. In other embodiments, the parameter of the light may comprise the wavelength of the light. In still other embodiments, the parameters of the light may comprise both the light intensity and the wavelength of the light. For example, a spectrometer may be utilized to detect the light intensity or the wavelength of the light emitted by the fluorescent probe layer.

At step 306, an environmental parameter of the light emitting layer in the detection unit is determined according to the parameter of the light emitted by the fluorescent probe layer.

In the detection unit, the parameter of the light emitted by the fluorescent probe layer may be affected by the environmental parameter of the light emitting layer. Therefore, the environmental parameter of the light emitting layer may be determined according to the parameter of the light emitted by the fluorescent probe layer.

In some implementations, the environmental parameter of the light emitting layer in the detection unit may be determined according to one of the wavelength of the light and the light intensity of the light emitted by the fluorescent probe layer.

In other implementations, the environmental parameter of the light emitting layer in the detection unit may be determined according to both the wavelength and the light intensity of the light emitted by the fluorescent probe layer. The environmental parameter of the light emitting layer in the detection unit determined in such a manner is more accurate. For example, a first environmental parameter of the light emitting layer in the detection unit may be determined according to the wavelength of the light emitted by the fluorescent probe layer; a second environmental parameter of the light emitting layer in the detection unit may be determined according to the light intensity of the light emitted by the fluorescent probe layer; and the environmental parameter of the light emitting layer in the detection unit may be determined according to the first environmental parameter and the second environmental parameter. For example, an average value of the first environmental parameter and the second environmental parameter can be calculated and as the environmental parameter of the light emitting layer in the detection unit.

In some embodiments, the environmental parameter of the light emitting layer may comprise one of temperature, humidity, or oxygen concentration. For example, if the temperature, the humidity, or the oxygen concentration of the light emitting layer exceeds a corresponding threshold, it may be considered that a displaying defect may be caused by the light emitting layer.

In the above embodiments, the environmental parameter of the light emitting layer may be determined according to the parameter of the light emitted by the fluorescent probe layer in the detection unit. Further, whether the displaying defect of the display panel is caused by the light emitting layer can be determined.

In some embodiments, the environmental parameter of the light emitting layer in the detection unit may be determined according to a correspondence between the parameter of the light emitted by the fluorescent probe layer and the environmental parameter of an environment in which the fluorescent probe layer is located.

An implementation for determining the above correspondence will be described below.

First, a sample is prepared by depositing a fluorescent probe layer on a substrate (for example, a glass substrate) to. Then, the sample is placed in a hermetic environment (e.g., a glove box). After that, the environmental parameters in the hermetic environment are adjusted. For example, the temperature, the humidity or the oxygen concentration is adjusted to a certain value. Then, the parameter of the light emitted by the sample, such as light intensity or wavelength, is detected. After that, the correspondence between the parameter of the light emitted by the sample and the current environmental parameters of the hermetic environment may be obtained.

According to the above manner, the correspondence between the different parameters of the light emitted by the sample and different environmental parameters of the hermetic environment may be obtained. That is, the correspondence between the parameter of the light emitted by the fluorescent probe layer and the environmental parameter of the environment in which the fluorescent probe layer is located may be obtained.

A method for manufacturing a display panel according to some embodiments of the present disclosure will be introduced below.

Figure 4:
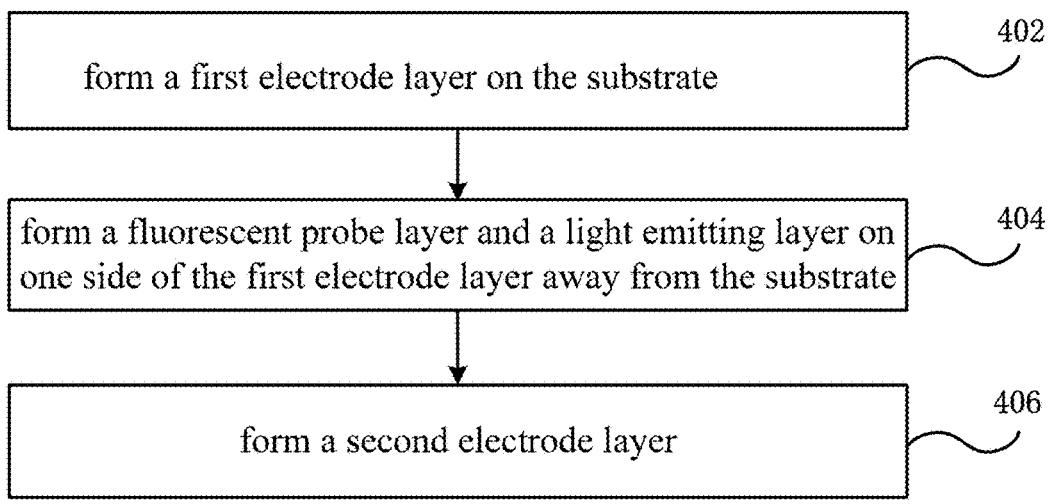
FIG. 4 is a schematic flow chart showing a method for manufacturing a display device according to an embodiment of the present disclosure.

FIG. 4 is a schematic flow chart showing a method for manufacturing a display device according to an embodiment of the present disclosure.

As shown in FIG. 4, at least one detection unit may be formed according to the steps 402-406, and one or more detection units may be formed on the substrate. In some embodiments, at least one detection unit is located in a non-pixel area of the display panel.

At step 402, a first electrode layer is formed on the substrate. The first electrode layer is, for example, an anode.

At step 404, a fluorescent probe layer and a light emitting layer are formed on one side of the first electrode layer away from the substrate.

For example, the fluorescent probe layer may be sensitive to one of temperature, humidity, or oxygen concentration. For example, the fluorescent probe layer may have a thickness ranging from 1 µm to 5 µm.

In some embodiments, a light emitting layer is formed on one side of the fluorescent probe layer away from the first electrode layer after the fluorescent probe layer is formed on the first electrode layer. In such a manner, adverse effect on the performance of the light emitting layer when the fluorescent probe layer is formed may be avoided.

At step 406, a second electrode layer is formed. The second electrode layer is, for example, a cathode.

Here, the fluorescent probe layer and the light emitting layer are located between the first electrode layer and the second electrode layer. For example, the second electrode layer may be located on the light emitting layer, that is, the light emitting layer is located between the second electrode layer and the fluorescent probe layer; or the second electrode layer may be located on the fluorescent probe layer, that is, the fluorescent probe layer is located between the second electrode layer and the light emitting layer.

The display panel formed in the above embodiments is provided with a detection unit comprising a fluorescent probe layer. The light emitted by the fluorescent probe layer may reflect the environmental parameter of the light emitting layer. Thus whether the displaying defect of the display panel is caused by the light emitting layer can be determined according to the environmental parameter of the light emitting layer.

Figure 5:
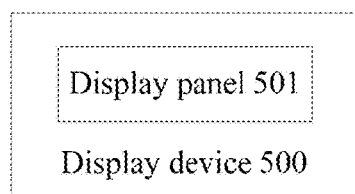
FIG. 5 is a schematic structural view showing a display device according to an embodiment of the present disclosure.

FIG. 5 is a schematic structural view showing a display device according to an embodiment of the present disclosure.

As shown in FIG. 5, the display device 500 may comprise the display panel 501 according to any one of the above embodiments. The display device 500 may be any product or member having a display function, such as a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel comprising one or more detection units located on a substrate, wherein at least one of the one or more detection units comprises:
    a first electrode layer and a second electrode layer opposite to the first electrode layer;
    a light emitting layer located between the first electrode layer and the second electrode layer; and
    a fluorescent probe layer located between the first electrode layer and the light emitting layer.

2. The display panel according to claim 1, wherein at least one of the one or more detection units is located in a non-pixel area of the display panel.

3. The display panel according to claim 2, wherein each of the one or more detection units is located in the non-pixel area.

4. The display panel according to claim 1, wherein the first electrode layer is located between the substrate and the light emitting layer.

5. The display panel according to claim 1, wherein the fluorescent probe layer is sensitive to one of temperature, humidity, or oxygen concentration.

6. The display panel according to claim 1, wherein the fluorescent probe layer has a thickness ranging from 1 µm to 5 µm.

7. A display device comprising: the display panel according to claim 1.

8. A detection method for a display panel, wherein the display panel comprises one or more detection units located on a substrate, wherein at least one of the one or more detection units comprises: a first electrode layer and a second electrode layer opposite to the first electrode layer; a light emitting layer located between the first electrode layer and the second electrode layer; and a fluorescent probe layer located between the first electrode layer and the light emitting layer;

the detection method comprises:

irradiating one of the one or more detection units with excitation light such that the fluorescent probe layer in the one of the one or more detection units emits light;

detecting at least one parameter of the light emitted by the fluorescent probe layer in the one of the one or more detection units; and determining an environmental parameter of the light emitting layer in the one of the one or more detection units according to the at least one parameter of the light emitted by the fluorescent probe layer in the one of the one or more detection units.

9. The detection method according to claim 8, wherein the environmental parameter of the light emitting layer in the one of the one or more detection units is determined according to a correspondence between the at least one parameter of the light emitted by the fluorescent probe layer in the one of the one or more detection units and the environmental parameter of an environment in which the fluorescent probe layer in the one of the one or more detection units is located.

10. The detection method according to claim 8, wherein the environmental parameter comprises one of temperature, humidity, or oxygen concentration.

11. The detection method according to claim 8, wherein the at least one parameter of the light comprises at least one of wavelength or light intensity of the light.

12. The detection method according to claim 11, wherein determining the environmental parameter comprises:

determining a first environmental parameter of the light emitting layer in the one of the one or more detection units according to the wavelength of the light emitted by the fluorescent probe layer in the one of the one or more detection units;

determining a second environmental parameter of the light emitting layer in the one of the one or more detection units according to the light intensity of the light emitted by the fluorescent probe layer in the one of the one or more detection units; and determining the environmental parameter of the light emitting layer in the one of the one or more detection units according to the first environmental parameter and the second environmental parameter.

13. The detection method according to claim 12, wherein determining the environmental parameter comprises:

calculating an average value of the first environmental parameter and the second environmental parameter as the environmental parameter of the light emitting layer in the one of the one or more detection units.

14. A method for manufacturing a display panel, comprising forming one or more detection units on a substrate, wherein forming at least one of the one or more detection units comprises:

forming a first electrode layer on the substrate;

forming a fluorescent probe layer and a light emitting layer on one side of the first electrode layer away from the substrate; and forming a second electrode layer, wherein the fluorescent probe layer and the light emitting layer are located between the first electrode layer and the second electrode layer.

15. The method according to claim 14, wherein at least one of the one or more detection units is located in a non-pixel area of the display panel.

16. The method according to claim 15, wherein each of the one or more detection units is located in the non-pixel area.

17. The method according to claim 14, wherein the light emitting layer is formed on one side of the fluorescent probe layer away from the first electrode layer after the fluorescent probe layer is formed.

18. The method according to claim 14, wherein the fluorescent probe layer is sensitive to one of temperature, humidity, or oxygen concentration.

19. The method according to claim 14, wherein the fluorescent probe layer has a thickness ranging from 1 µm to 5 µm.

* * * * *